United States Patent
Jebory et al.

(10) Patent No.: US 9,673,081 B2
(45) Date of Patent: Jun. 6, 2017

(54) ISOLATED THROUGH SILICON VIA AND ISOLATED DEEP SILICON VIA HAVING TOTAL OR PARTIAL ISOLATION

(71) Applicant: Newport Fab, LLC, Newport Beach, CA (US)

(72) Inventors: Hadi Jebory, Irvine, CA (US); David J. Howard, Irvine, CA (US); Marco Racanelli, Santa Ana, CA (US); Edward Preisler, San Clemente, CA (US)

(73) Assignee: Newport Fab, LLC, Newport Beach, CA (US)

( * ) Notice: Subject to any disclaimer, the term of this patent is extended or adjusted under 35 U.S.C. 154(b) by 0 days.

(21) Appl. No.: 13/874,656

(22) Filed: May 1, 2013

(65) Prior Publication Data

US 2013/0313682 A1    Nov. 28, 2013

Related U.S. Application Data (60) Provisional application No. 61/652,057, filed on May 25, 2012.

(51) Int. Cl.
| | |
|---|---|
| H01L 21/76 | (2006.01) |
| H01L 21/761 | (2006.01) |
| H01L 29/06 | (2006.01) |
| H01L 21/768 | (2006.01) |
| H01L 23/48 | (2006.01) |
| H01L 21/225 | (2006.01) |
| H01L 21/265 | (2006.01) |

(52) U.S. Cl.
CPC ...... *H01L 21/761* (2013.01); *H01L 21/76898* (2013.01); *H01L 23/481* (2013.01); *H01L 29/0646* (2013.01); *H01L 21/2257* (2013.01); *H01L 21/26586* (2013.01); *H01L 2924/0002* (2013.01)

(58) Field of Classification Search
CPC ............... H01L 21/761; H01L 29/0646; H01L 21/76898; H01L 21/26586; H01L 21/2257
USPC ......... 438/424, 652; 257/659, 750, 762, 763
See application file for complete search history.

(56) References Cited

U.S. PATENT DOCUMENTS

| | | | |
|---|---|---|---|
| 7,276,794 B2 * | 10/2007 | Wilner | 257/742 |
| 2001/0041400 A1 * | 11/2001 | Ren et al. | 438/200 |
| 2007/0072400 A1 * | 3/2007 | Bakeman, Jr. | 438/487 |

(Continued)

*Primary Examiner* — Reema Patel
*Assistant Examiner* — Syed Gheyas
(74) *Attorney, Agent, or Firm* — Farjami & Farjami LLP (57) ABSTRACT

Disclosed are a structure for improving electrical signal isolation in a semiconductor substrate and an associated method for the structure's fabrication. The structure includes a deep trench having sidewalls disposed in the semiconductor substrate. An isolation region may be formed along at least an upper portion of the sidewalls of the deep trench, and a metallic filler may be disposed in the deep trench. The isolation region may include a PN junction formed by one or more of ion implantation and annealing, deposition of highly doped polysilicon and out diffusion, and gas phase doping and annealing. In the alternative, the isolation region may be a dielectric isolation region formed by one or more of uniform dielectric deposition, partial dieletric deposition, and dielectric deposition by ionic reaction.

9 Claims, 9 Drawing Sheets

(56) References Cited

U.S. PATENT DOCUMENTS

2010/0301412 A1* 12/2010 Parthasarathy et al. ...... 257/337
2011/0018109 A1*  1/2011 Blaschke et al. ............. 257/659

* cited by examiner

ISOLATED THROUGH SILICON VIA AND ISOLATED DEEP SILICON VIA HAVING TOTAL OR PARTIAL ISOLATION

The present application claims the benefit of and priority to a provisional patent application entitled "Isolated Through Silicon Via and Isolated Deep Silicon Via Having Total or Partial Isolation", Ser. No. 61/652,057 filed on May 25, 2012. The disclosure in this provisional application is hereby incorporated fully by reference into the present application.

BACKGROUND

As semiconductor devices continue to decrease in size, noise isolation becomes increasingly difficult to maintain. A conventional method of controlling noise isolation has been the manipulation of the semiconductor substrate resistivity. Typically, higher substrate resistivity results in higher noise isolation between devices or terminals within a device. Thus, high resistivity substrates are becoming more popular in applications requiring a high degree of intra-substrate noise isolation. However, because high resistivity substrates have very low doping concentrations, large electric fields can form between points having high potential differences in the substrate, such as between the collector and emitter of bipolar junction transistors. For example, voltage differences between an emitter and collector can deplete the substrate of charge carriers, significantly increasing the electric field in the substrate, causing DC breakdown.

In addition, conventional external interconnection of bipolar devices typically includes wire bonding topside contacts to a leadframe several millimeters away. However, such wirebonds and long interconnect paths tend to have unacceptably high resistance and/or inductance, thus, necessitating multiple wires or connections.

SUMMARY

The present disclosure is directed to isolated through silicon vias and isolated deep silicon vias having total or partial isolation, substantially as shown in and/or described in connection with at least one of the figures, and as set forth more completely in the claims.

DETAILED DESCRIPTION

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

The present inventive concepts utilize isolated through silicon vias (iTSVs) and/or isolated deep silicon vias (iDSVs) to reduce the occurrence of breakdown in high resistivity substrates while maintaining a high level of noise isolation intra-substrate. The advantages of the present inventive concepts include elimination of an extra masking step during fabrication, deeper isolation into the substrate than that provided with device implant doping, total isolation to any deep front end of line (FEOL) devices within the substrate, and lower external contact resistances and inductances.

Figure 1:
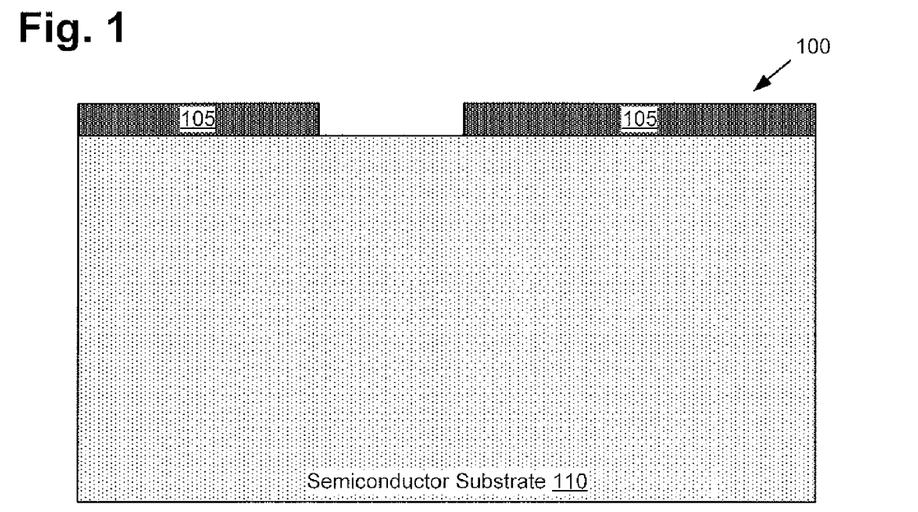
FIG. 1 illustrates an exemplary cross-sectional diagram of a semiconductor structure, fabricated according to one implementation of the present application.
Figure 2:
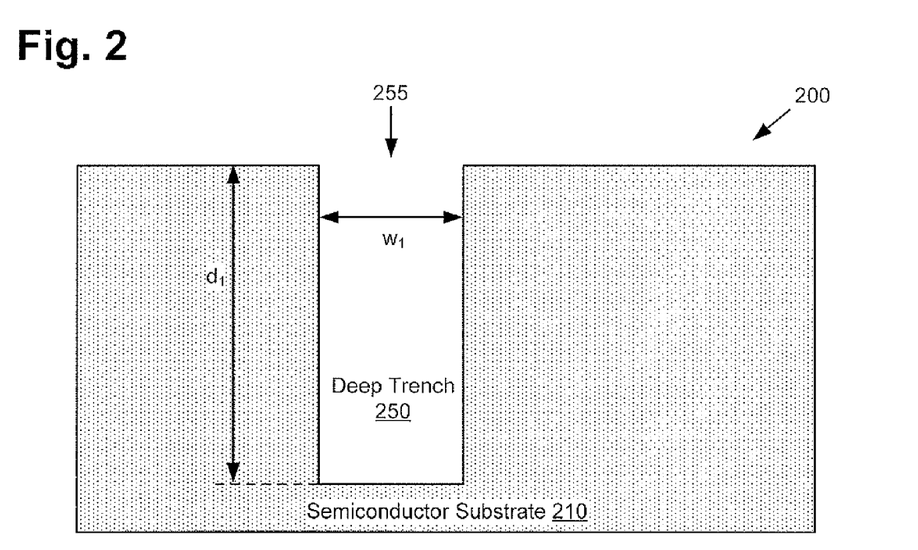
FIG. 2 illustrates an exemplary cross-sectional diagram of a semiconductor structure, fabricated according to one implementation of the present application.

Various methods of fabrication will now be described with reference to FIGS. 1 through 4. FIG. 4 presents an exemplary flowchart of actions taken to fabricate an isolated TSV, according to an implementation of the present application. FIGS. 1 and 2 illustrate exemplary cross-sectional diagrams of a semiconductor structure, fabricated according to one implementation of the present application. FIGS. 3A-3G illustrate exemplary isolated TSVs having isolation regions fabricated according to one or more implementations of the present application.

Flowchart 400 of FIG. 4 begins with action 410, including fabricating a deep trench having sidewalls into the semiconductor substrate. FIG. 1 shows semiconductor structure 100 before application of action 410. Semiconductor structure 100 may include semiconductor substrate 110, which may be silicon. However, semiconductor substrate 110 is not limited to silicon and may be any appropriate semiconductor material. Semiconductor substrate 110 may be a high resistivity substrate, having a resistivity of greater than or equal to 500 Ω/cm. A photoresist layer 105 may be disposed on or over semiconductor substrate 110. Once the photoresist layer has been deposited, semiconductor substrate 110 may be etched to form one or more deep trenches, according to action 410 and as shown by FIG. 2.

FIG. 2 shows semiconductor structure 200 including deep trench 250 formed to a desired depth $d_1$ of between 50 and 100 mm, for example. Deep trench 250 may have a very high aspect ratio, for example between 18:1 and 33:1. Thus, in one implementation, deep trench 250 may have a critical dimension (CD) width $w_1$ of approximately 3 µm. After the deep etch, the deep trench may be stripped and cleaned using any appropriate cleaning method.

Flowchart 400 continues with action 420, including forming an isolation region along at least an upper portion of the sidewalls of the deep trench. The deep trench may be completely or partially isolated. The isolation regions may be formed as either a PN junction or as a dielectric layer within the deep trench by one or more of several processes. For example, FIGS. 3A, 3B, 3C and 3D show formation of an isolation region by one of 1) ion implantation and annealing, 2) deposition of highly doped polysilicon and out diffusion, and 3) gas phase doping and annealing. In the alternative, dielectric isolation regions may be formed as a dielectric layer along at least an upper portion of the deep trench, as shown by FIGS. 3E, 3F and 3G. Fabrication of isolation regions within the deep trench will be discussed in more detail below with respect to FIGS. 3A through 3G and FIGS. 5 and 6.

Figure 7A:
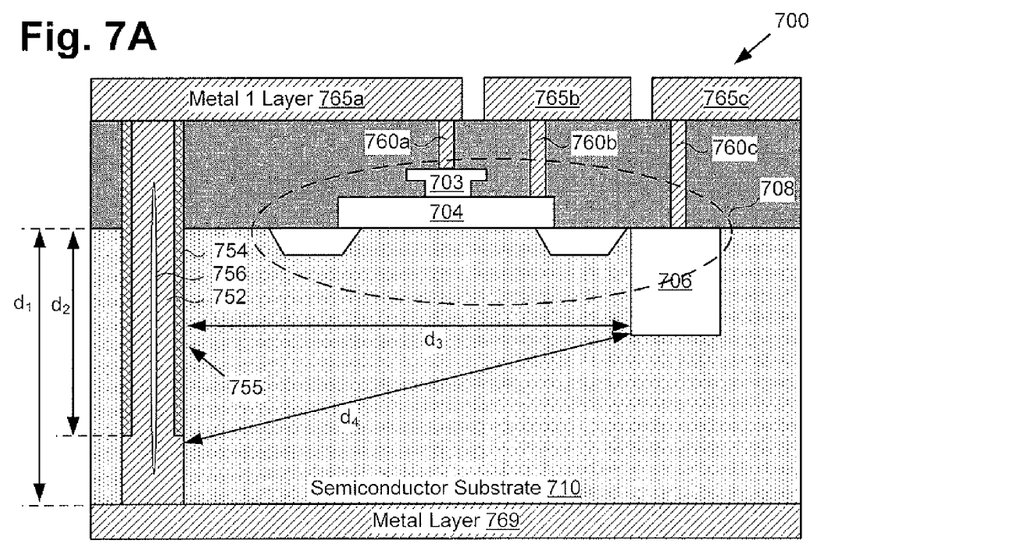
FIG. 7A illustrates an exemplary cross sectional diagram of an isolated TSV in conjunction with a bipolar device, according to an implementation of the present application.
Figure 7B:
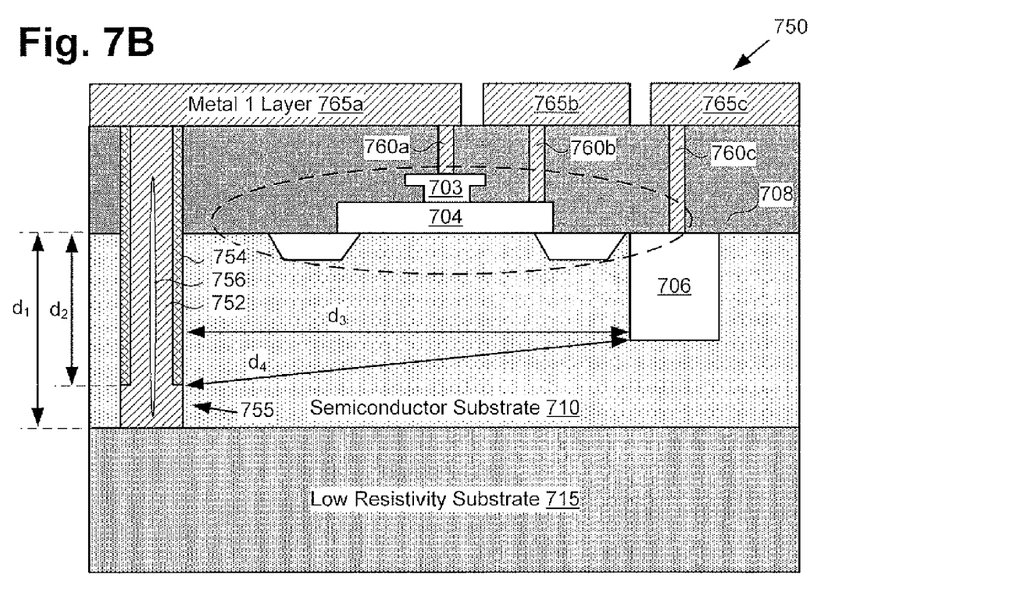
FIG. 7B illustrates an exemplary cross sectional diagram of an isolated DSV in conjunction with a bipolar device, according to an implementation of the present application.

Once deep trench 250 is properly isolated, flowchart 400 may continue with action 430. Action 430 includes filling the deep trench with a metallic filler. The metallic filler may be titanium, tungsten, or any other suitable electrically conductive metallic filler or metallic filler stack. Examples of filled iTSVs and iDSVs are shown in FIGS. 7A and 7B, respectively, which will be discussed in more detail below.

As previously stated, FIGS. 3A through 3D illustrate iTSVs having an isolation region including a PN junction fabricated according to one of several implementations of the present inventive concepts. Each of FIGS. 3A through 3D will now be discussed with reference to flowchart 520 of FIG. 5.

In each of FIGS. 3A through 3D semiconductor structures 300, 325, 335 and 345 may include semiconductor substrate 310 having deep trench 350. Deep trench 350 may have a depth, $d_1$, of 100 µm and a width, $w_1$, of 3 µm, for example. However, deep trench 350 is not so limited and may have a depth and width different from those specified above. In addition, semiconductor substrate 310 may be a P-type substrate. However, semiconductor substrate 310 may instead be an N-type substrate, in which case, all conductivity types expressed below may be of the opposite type. In addition, though each of FIGS. 3A through 3D refer to iTSVs, the teachings may be equally applied to iDSVs where the trench does not extend completely through the substrate.

Figure 4:
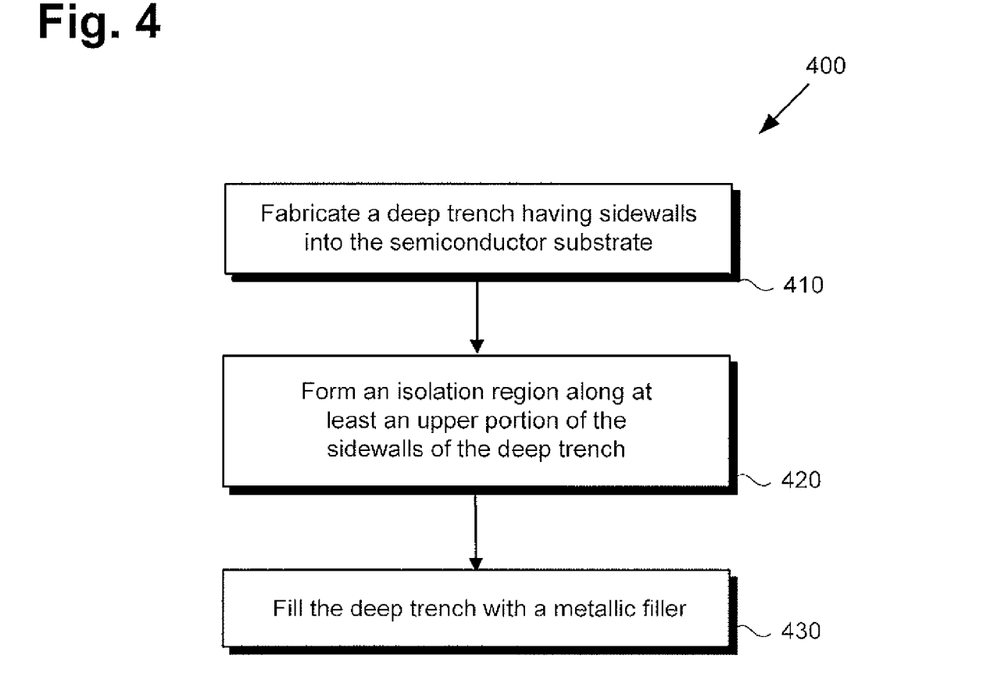
FIG. 4 presents an exemplary flowchart of actions taken to fabricate an isolated TSV, according to an implementation of the present application.
Figure 5:
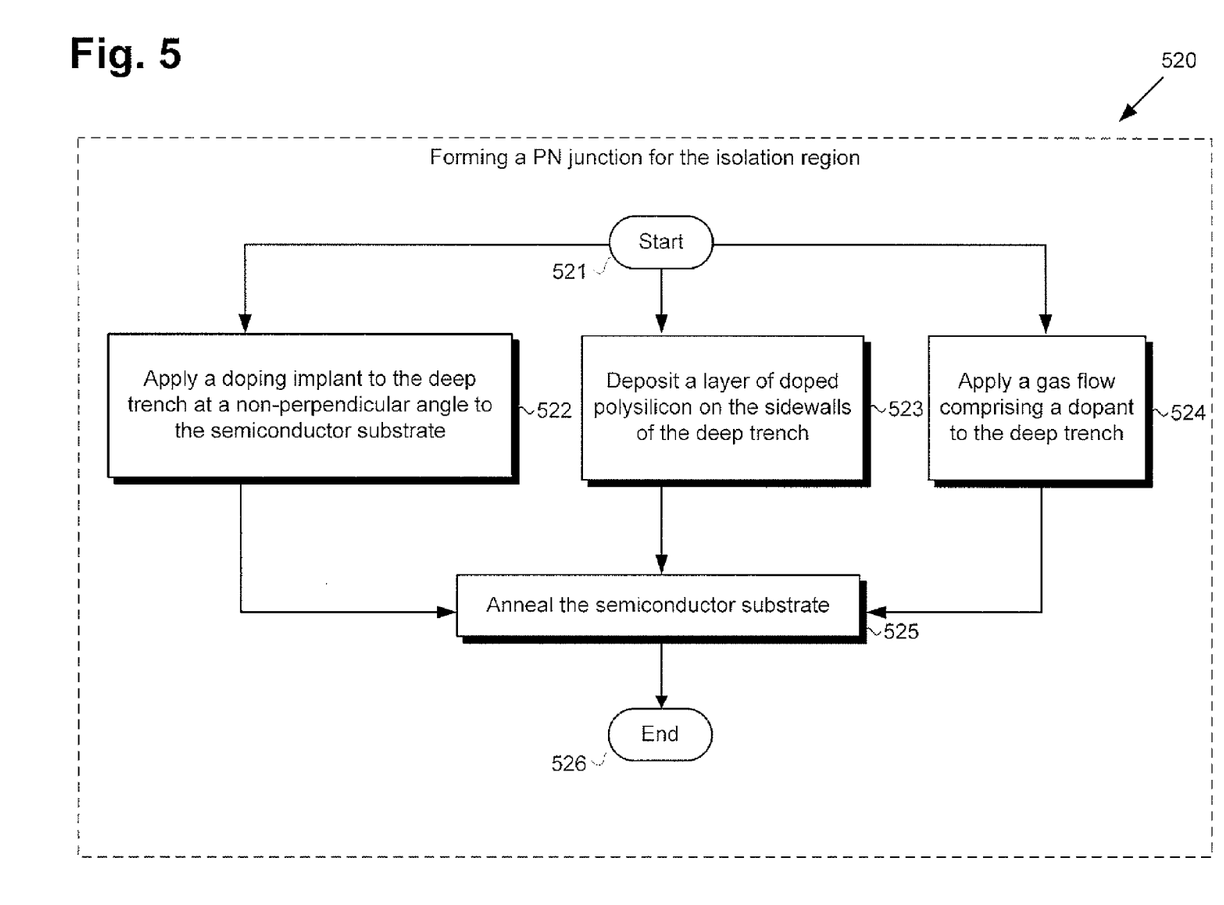
FIG. 5 presents an exemplary flowchart of actions taken to fabricate a PN junction as an isolation region, according to one or more implementations of the present application.

FIG. 5 presents an exemplary flowchart of actions taken to fabricate a PN junction as an isolation region, according to one or more implementations of the present application. Each action of flowchart 520 may correspond to subactions of action 420 of flowchart 400 described above. Flowchart 520 may begin with Start 521, may move to one of actions 522, 523 or 524, and may finish with End 526. Action 522 includes applying a doping implant to the deep trench at a non-perpendicular angle to the semiconductor substrate.

Figure 3A:
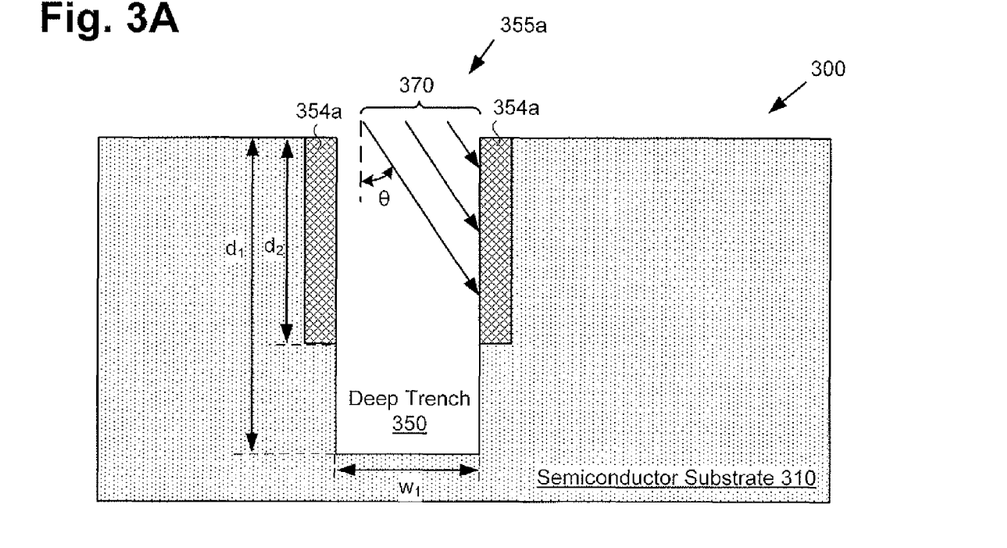
FIG. 3A illustrates an exemplary isolated TSV having a PN junction as a partial isolation region fabricated by ion implantation and annealing, according to an implementation of the present application.

FIG. 3A may correspond to semiconductor structure 200 of FIG. 2 after application of action 522. FIG. 3A presents an iTSV having a PN junction as a partial isolation region fabricated by ion implantation and annealing, according to an implementation of the present application. N-type implant 370 may be applied at an angle θ° with respect to semiconductor substrate 310. Exemplary N-type dopants may include arsenic and/or phosphorus. Because trench 350 has a very high aspect ratio, applying N-type implant 370 at small angles allows the formation of partial isolation region 354a to depth $d_2$, which may be 20 µm for example. This is due to the blocking effect semiconductor substrate 310 provides for the lower portions of trench 350 when implant 370 is applied at angle θ°. The implant may be repeated at angle −θ° to form partial isolation region 354a on the opposite sidewall of semiconductor substrate 310. Thus, implant depth $d_2$ may be adjusted by controlling the angle of implant.

Once implantation is complete, semiconductor substrate 310 may be annealed. As such, action 525 of flowchart 520 includes annealing the semiconductor substrate. Thus, N-type partial isolation region 354a creates a PN junction with P-type semiconductor substrate 310, effectively isolating the upper portions of iTSV 355a from RF noise and reducing the chance for occurrence of DC voltage breakdown in the substrate.

In the alternative, flowchart 520 may begin with Start 521 and may continue to action 523, which includes depositing a layer of doped polysilicon on the sidewalls of the deep trench. This layer of doped polysilicon may extend along the entire height, or only along an upper portion, of the sidewalls of the deep trench.

Figure 3B:
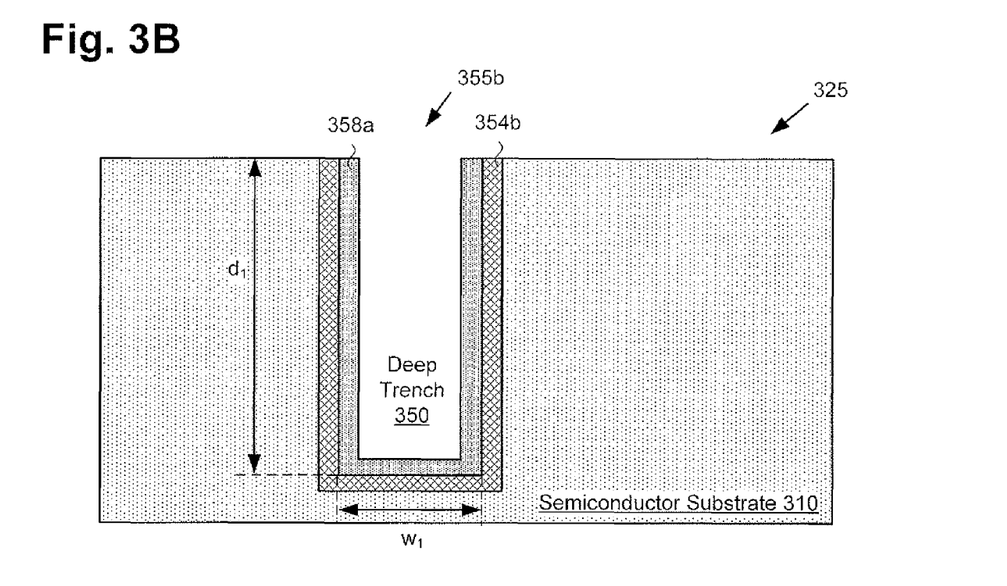
FIG. 3B illustrates an exemplary isolated TSV having a PN junction as a complete isolation region fabricated by polysilicon deposition and out diffusion, according to an implementation of the present application.

FIG. 3B presents an iTSV having a PN junction as a complete isolation region fabricated by polysilicon deposition and out diffusion, according to an implementation of the present application. In FIG. 3B, a uniform layer of N+ polysilicon 358a may be deposited on the sidewalk of deep trench 350. Such a uniform layer of polysilicon may be deposited where the aspect ratio of deep trench 350 is small enough to allow the utilized deposition technology to deposit a uniform layer. Semiconductor structure 325 may then be annealed at high temperature causing out-diffusion of the N-type dopants of uniform polysilicon layer 358a into the sidewalls of deep trench 350, and forming N-type uniform isolation region 354b. This out-diffusion may also correspond to annealing action 525 of flowchart 520. Thus, N-type uniform isolation region 354b may create a PN junction with P-type semiconductor substrate 310, effectively isolating iTSV 355b from RF noise and reducing the chance for occurrence of DC voltage breakdown in the substrate along the entire depth of the iTSV.

Figure 3C:
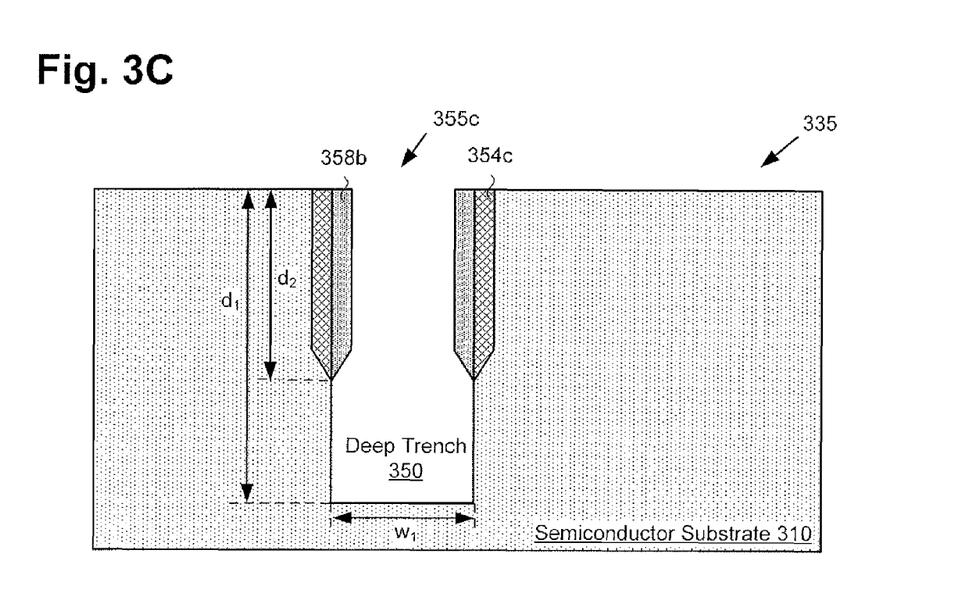
FIG. 3C illustrates an exemplary isolated TSV having a PN junction as a partial isolation region fabricated by polysilicon deposition and out diffusion, according to an implementation of the present application.

Also corresponding to action 522 of flowchart 520, FIG. 3C presents an iTSV having a PN junction as a partial isolation region fabricated by polysilicon deposition and out diffusion along the upper portion of the iTSV, according to an implementation of the present application. A layer of N+ polysilicon 358b may be deposited on an upper portion of the sidewalls of deep trench 350 such that the thickness of the layer of polysilicon may decrease with the depth of deep trench 350. Accordingly, conventional deposition and fabrication techniques incapable of completely filling narrow trenches with high aspect ratios may be utilized, reducing fabrication costs. N+ polysilicon 358b may be deposited to a depth $d_2$, which may be 20 μm. However $d_2$ is not so limited and and may be any depth less than the full depth $d_1$ of deep trench 350. Semiconductor structure 335 may then be annealed at high temperature causing out-diffusion of the N-type dopants of N+ polysilicon layer 358b into the sidewalls of deep trench 350, and forming N-type partial isolation region 354c. This out-diffusion may also correspond to annealing action 525 of flowchart 520. Thus, N-type partial isolation region 354c creates a PN junction with P-type semiconductor substrate 310, effectively isolating the upper portions of iTSV 355c from RF noise reducing the chance for occurrence of DC voltage breakdown in the substrate.

Figure 3D:
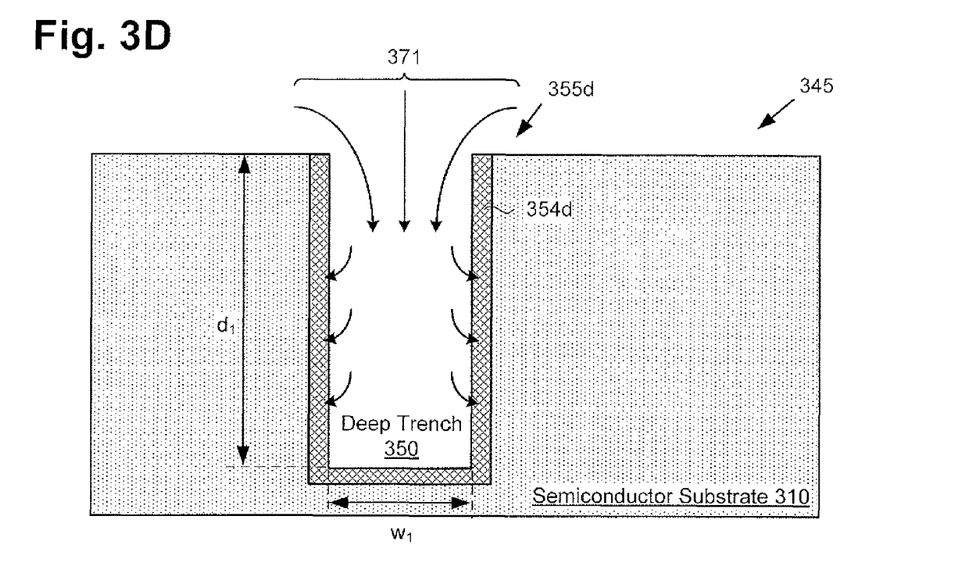
FIG. 3D illustrates an exemplary isolated TSV having a PN junction as an isolation region fabricated by gas phase doping and annealing, according to an implementation of the present application.
Figure 3E:
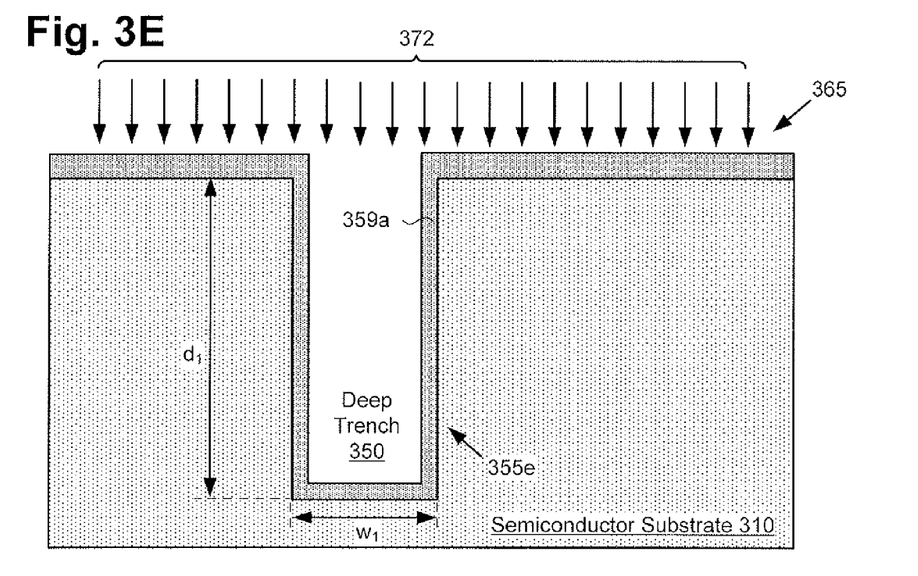
FIG. 3E illustrates an exemplary isolated TSV having a uniform dielectric isolation region fabricated by dielectric deposition, according to an implementation of the present application.
Figure 3F:
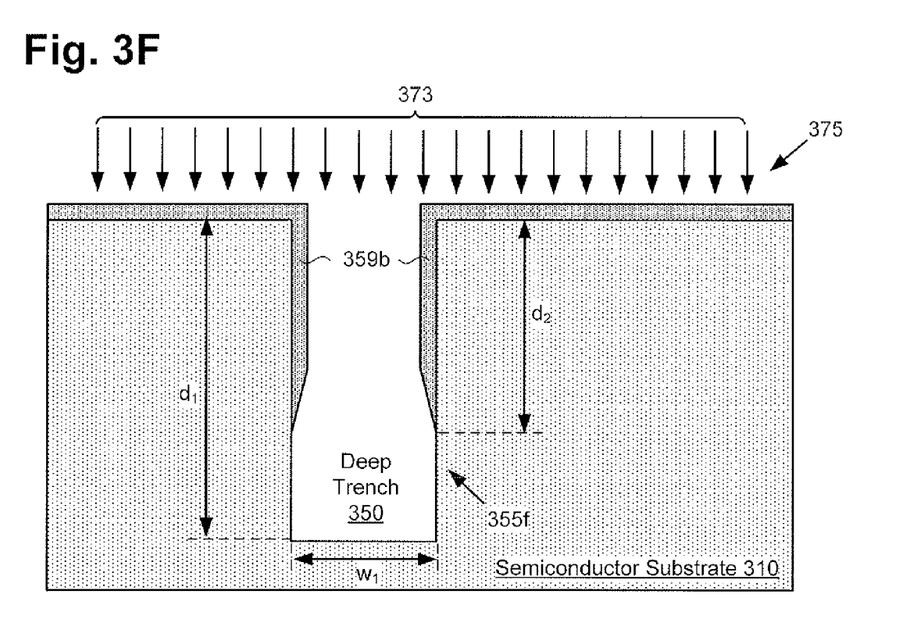
FIG. 3F illustrates an exemplary isolated TSV having a partial dielectric isolation region fabricated by dielectric deposition, according to an implementation of the present application.
Figure 3G:
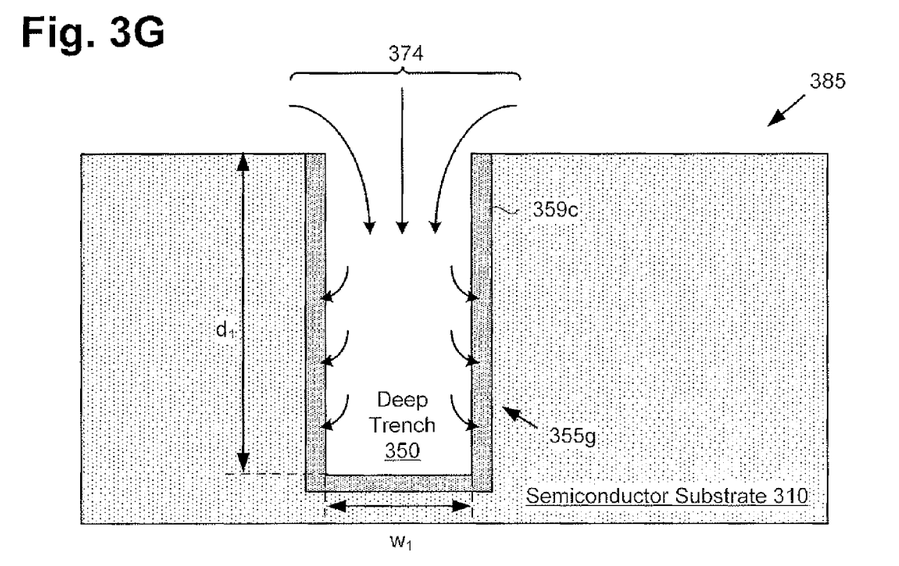
FIG. 3G illustrates an exemplary isolated TSV having a dielectric isolation region fabricated by ionic reaction, according to an implementation of the present application.

In yet another alternative, flowchart 520 may begin with Start 521 and may continue to action 524, which includes applying a gas flow comprising a dopant to the deep trench. FIG. 3D presents an iTSV having a PN junction as an isolation region fabricated by gas phase doping and annealing, according to an implementation of the present application. In FIG. 3D, isolation region 354d may be formed by subjecting the sidewalls of deep trench 350 to a gas flow 371 containing an N-type dopant. Gas flow 371 may include high levels of arsenic and/or phosphorus, for example. Under high temperature, the N-type dopants of gas flow 371 may react with the sidewalls of deep trench 350 forming N-type isolation region 354d. However, because deep trench 350 is not open at its bottom, gas may not necessarily flow uniformly into deep trench 350. Thus, the uniformity and concentration of the N-type doping of isolation region 354d is dependent on the temperature, pressure, and flow rate of the gas, the aspect ratio of the deep trench, and the characteristics of the opening of the deep trench. For example, increasing the flow rate and/or decreasing the pressure during gas flow may allow for a more even doping of the sidewalls of deep trench 350. Because the uniformity of the gas phase doping may be controlled, isolation region 354d may be disposed along the entire sidewall of deep trench 350.

In the alternative, isolation region 354d may be a partial isolation region, extending along only an upper portion of deep trench 350. Such a partial isolation region may be desired where the aspect ratio of deep trench 350 is very large. Semiconductor structure 345 may then be annealed at high temperature to further diffuse the N-type dopants into the sidewalls of deep trench 350, forming N-type isolation region 354d. This out-diffusion may also correspond to annealing action 525 of flowchart 520.

Thus, N-type isolation region 354d in semiconductor structure 345 of FIG. 3D creates a PN junction with P-type semiconductor substrate 310, effectively isolating at least the upper portions of iTSV 355d from RF noise and reducing the chance for occurrence of DC voltage breakdown in the substrate.

As previously stated, FIGS. 3E through 3G illustrate iTSVs having a dielectric isolation region fabricated by one of several implementations of the present inventive concepts. Specifically, FIGS. 3E through 3G present at least three methods by which a dielectric isolation region may be fabricated: 1) uniform dielectric deposition, 2) partial dielectric deposition, and 3) dielectric deposition by ionic reaction. In each of FIGS. 3E through 3G semiconductor structures 365, 375 and 385 may include semiconductor substrate 310 having deep trench 350. Though each of FIGS. 3E through 3G refer to iTSVs, the teachings may be equally applied to iDSVs where the trench does not extend completely through the substrate. Each of FIGS. 3E through 3G will now be discussed with reference to flowchart 620 of FIG. 6.

Figure 6:
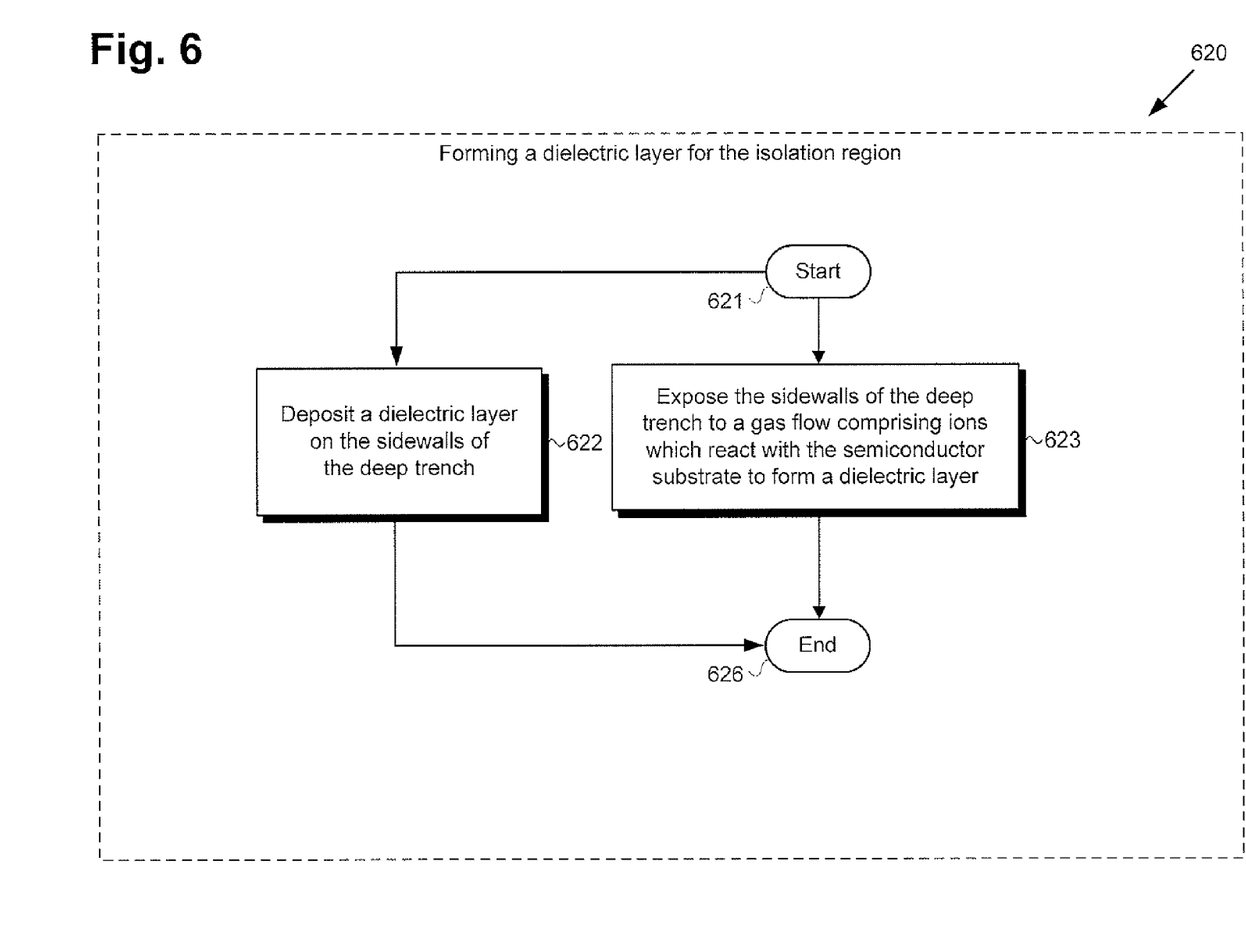
FIG. 6 presents an exemplary flowchart of actions taken to fabricate a dielectric layer as an isolation region, according to one or more implementations of the present application.

FIG. 6 presents an exemplary flowchart of actions taken to fabricate a dielectric isolation region, according to one or more implementations of the present application. Each action of flowchart 620 may correspond to subactions of action 420 of flowchart 400 described above. Flowchart 620 may begin with Start 621, may move to one of actions 622 or 623, and may finish with End 626. Action 622 includes depositing a dielectric layer on the sidewalls of the deep trench.

FIG. 3E illustrates an exemplary isolated TSV having a uniform dielectric isolation region fabricated by dielectric deposition, according to an implementation of the present application. A uniform dielectric layer 359a may be deposited on the sidewalls of deep trench 350 by dielectric deposition 372. Such a uniform dielectric layer may be deposited where the aspect ratio of deep trench 350 is small enough to allow the utilized deposition technology to deposit a uniform layer. Exemplary dielectric materials may include oxides, nitrides, or any other suitable dielectric material. Exemplary deposition techniques may include chemical vapor deposition (CVD), atomic layer deposition (ALD), plasma enhanced CVD (PECVD), and plasma assisted CVD (PACVD). Thus, uniform dielectric layer 359a may form a uniform isolation region, effectively isolating iTSV 355e from RF noise and reducing the chance for occurrence of DC voltage breakdown in the substrate along the entire depth of the iTSV.

FIG. 3F presents an iTSV having a partial dielectric isolation region fabricated by dielectric deposition, according to an implementation of the present application. Of the exemplary deposition techniques discussed above regarding FIG. 3E, CVD and PECVD are least likely to allow for uniform dielectric deposition along the entire depth of deep trench 350 if the deep trench aspect ratio is high. Thus, in another implementation, a dielectric layer 359b may be deposited on an upper portion of the sidewalls of deep trench 350, by dielectric deposition 373, such that the thickness of such a dielectric layer may decrease with the depth of deep trench 350. Accordingly, deposition and fabrication techniques incapable of uniformly depositing to sidewalls of trenches with high aspect ratios may be utilized, reducing fabrication costs. Thus, partial dielectric layer 359b may form a partial isolation region, effectively isolating the upper portion of iTSV 355f from RF noise and reducing the chance for occurrence of DC voltage breakdown in the substrate.

In the alternative, flowchart 620 may begin with Start 621 and may continue to action 623, which includes applying a gas flow comprising a dopant to the deep trench. FIG. 3G presents an iTSV having a dielectric isolation region fabricated by ionic reaction, according to an implementation of the present application. In FIG. 3G, dielectric isolation region 359c may be formed by subjecting the sidewalk of deep trench 350 to gas flow 374 containing ions which may react with semiconductor substrate 310. However, because deep trench 350 is not open at its bottom, gas may not necessarily flow uniformly into deep trench 350. Thus, the uniformity and concentration of dielectric isolation region 359c is dependent on the temperature and flow rate of the gas, the aspect ratio of the deep trench, the gas pressure during flow, and the characteristics of the opening of the deep trench. For example, increasing the flow rate, or decreasing the pressure during gas flow may allow for a more even deposition to the sidewalls of deep trench 350. Because the uniformity of deposition may be controlled, dielectric isolation region 359c may be disposed along the entire sidewall of deep trench 350.

In the alternative, dielectric isolation region 359c may be a partial dielectric isolation region, extending along only an upper portion of deep trench 350. Such a partial dielectric isolation region may be desired where the aspect ratio of deep trench 350 is very large. Gas flow 374 may include ions of silane, oxygen, argon, or nitrogen, for example. Where oxygen ions are utilized, ozone may provide oxygen ions within gas flow 374 to react with silicon in the sidewalls of deep trench 350, forming silicon oxide, for example. Thus, dielectric isolation region 359c effectively isolates at least the upper portions of iTSV 355g from RF noise and reduces the chance for occurrence of DC voltage breakdown in the substrate.

Once the iTSVs have been isolated according to one or more methods relating to FIG. 3A through 3G, each iTSV may be filled with a metallic filler according to action 430 of flowchart 400, and further processed as needed according to the particular application.

Each of the iTSVs shown in FIGS. 3A through 3G may be utilized in conjunction with one or more active or passive electrical components within a semiconductor substrate to provide a reduced occurrence of breakdown in high resistivity substrates while maintaining a high level of noise isolation intra-substrate. FIG. 7A presents an exemplary cross sectional diagram of an isolated TSV in conjunction with a bipolar device, according to an implementation of the present application. Semiconductor structure 700 may include semiconductor substrate 710 having bipolar device 708, which may be a bipolar, junction transistor, for example. Bipolar device 708 may include emitter 703, base 704, and collector 706, each disposed on or in semiconductor substrate 710. Each of emitter 703, base 704 and collector 706 may be connected to metal 1 layers 765a, 765b, and 765c by conductive vias 760a, 760b, and 760c, respectively. iTSV 755 may extend from a top surface to a bottom surface of semiconductor substrate 710 and may be electrically connected to both metal 1 layer 765a and backside metal layer 769, disposed on the backside of semiconductor substrate 710. iTSV 755 may extend into semiconductor substrate 710 to a depth $d_1$ of 100 µm. However, $d_1$ is not limited to 100 µm and may be any depth suitable to a particular application. In addition, iTSV 755 may include isolation region 754 along at least an upper portion of iTSV 755. Isolation region 754 may be formed as a PN junction or as a dielectric layer, according to one of FIGS. 3A through 3G. iTSV 755 may further include metallic filler 752, which may be titanium or tungsten, for example, and may or may not have a hollow cavity 756 within metallic filler 752.

In operation, collector 706 may be connected to a positive voltage, for example 10V, while emitter 760 may be connected to a ground voltage. Thus, metal 1 layer 765a, emitter 702, metallic filler 752, and backside metal layer 769 may each be biased at substantially ground voltage. Collector 706 may be separated from iTSV 755 by a straight-line distance $d_3$, which may be approximately 70 µm, as one example. Additionally, in one implementation, collector 706 may have a depth of 10-20 µm.

If iTSV 755 were not isolated, signals or potentials at collector 706 could induce ground noise in iTSV 755, having a strength related to the doping concentration of substrate 710 and the straight-line distance $d_3$ between collector 706 and iTSV 755. As stated previously, high voltage handling may be a design requirement. Thus, semiconductor substrate 710 may have a high resistivity of greater than or equal to 500 Ω/cm, for example. Such high resistivity reduces RE crosstalk and noise leakage in or through the substrate. However, high resistivity substrates typically require very low impurity doping. Consequently, when a voltage difference exists between collector 706 and iTSV 755, semiconductor substrate 710 becomes fully depleted of charge carriers. This may cause the electric field between collector 706 and iTSV 755 to become large enough to cause breakdown of semiconductor substrate 710, resulting in a short circuit between the collector and emitter due to substrate breakdown. However, such breakdown cannot be satisfactorily avoided by increasing the impurity doping concentration of semiconductor substrate 710 because lowering the resistivity of the substrate increases radio frequency (RF) noise leakage.

Thus, reduced electric field intensity may be achieved by partially isolating iTSV 755 utilizing isolation region 754. Isolation region 754 may provide complete isolation of iTSV 755 over a partial depth $d_2$ of iTSV 755, thus increasing the distance between collector 706 and the uninsulated ground potential from distance $d_3$ to a longer distance $d_4$. As stated previously, the depth, $d_1$, of iTSV 755 may be approximately 100 µm, for instance. In such an instance, partial depth $d_2$ may be at least 20 µm and may be 70 µm or more in some applications. Thus, partially isolating iTSV 755 effectively increases the electrical distance between collector 706 and iTSV 755, reduces the electric field and increases the voltage handling of semiconductor structure 700. Moreover, because RF noise tends to be strongest near the top of the substrate, where active devices are placed, partial isolation of iTSV 755 also greatly attenuates RF noise induced in the upper portions of the substrate. In this manner, complete isolation of iTSV 755 is not required. Where a PN junction is utilized to form the isolation region, reverse biasing the PN junction may also increase RF isolation and further increase the breakdown voltage of the substrate.

FIG. 7B presents an exemplary cross sectional diagram of an isolated DSV in conjunction with a bipolar device, according to an implementation of the present application. Where an iTSV does not extend completely through to a backside of the semiconductor substrate, the insulated via may be an iDSV. Semiconductor structure 725 of FIG. 7B may be substantially similar to semiconductor structure 700 of FIG. 7A, except that iDSV 750 does not extend to a bottom surface of the semiconductor structure. Rather, at the bottom of iDSV 750, low resistivity substrate 715 may contact a bottom surface of high resistivity semiconductor substrate 710. Low resistivity substrate 715 may be heavily doped with P-type impurities, for example, to provide the substrate with a low resistance.

Accordingly, the present inventive concepts utilize iTSVs and/or iDSVs to reduce the occurrence of breakdown in high resistivity substrates while maintaining a high level of noise isolation intra-substrate. The advantages of the present inventive concepts may include elimination of an extra masking step during fabrication, deeper isolation into the substrate than that possible with device implant doping, total isolation to any deep front end of line (FEOL) devices within the substrate, and lower external contact resistances and inductances.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the spirit and the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A method for improving electrical signal isolation in a semiconductor substrate, said method comprising:
   fabricating a deep trench having sidewalls into said semiconductor substrate having a first conductivity type and a high resistivity, wherein said deep trench has an aspect ratio greater than or approximately equal to 18:1;
   forming a non-dielectric partial isolation region having a second conductivity type along an upper portion of said sidewalls of said deep trench;
   wherein said non-dielectric partial isolation region extends deeper into said semiconductor substrate than a collector of a bipolar device disposed in said semiconductor substrate so as to increase radio frequency isolation and reduce occurrence of DC voltage breakdown in said semiconductor substrate due to an electric field between said collector and said deep trench.

2. The method of claim 1, wherein said deep trench is part of a through silicon via.

3. The method of claim 1, wherein said deep trench is part of a deep silicon via.

4. The method of claim 1, wherein said forming said non-dielectric partial isolation region comprises applying a doping implant to said deep trench at a non-perpendicular angle to form a PN junction in said upper portion of said sidewalls of said deep trench.

5. The method of claim 1, further comprising filling said deep trench with a metallic filler.

6. A structure for improving electrical signal isolation in a semiconductor substrate, said structure comprising:
   a deep trench having sidewalls disposed in said semiconductor substrate having a first conductivity type and a high resistivity, wherein said deep trench has an aspect ratio greater than or approximately equal to 18:1;
   a non-dielectric partial isolation region having a second conductivity type formed along an upper portion of said sidewalls of said deep trench;
   wherein said non-dielectric partial isolation region extends deeper into said semiconductor substrate than a collector of a bipolar device disposed in said semiconductor substrate so as to increase radio frequency isolation and reduce occurrence of DC voltage breakdown in said semiconductor substrate due to an electric field between said collector and said deep trench.

7. The structure of claim 6, wherein said deep trench is part of a through silicon via.

8. The structure of claim 6, wherein said deep trench is part of a through silicon via.

9. The structure of claim 6, wherein said non-dielectric partial isolation region comprises a PN junction formed in said upper portion of said sidewalk of said deep trench.

* * * * *

UNITED STATES PATENT AND TRADEMARK OFFICE
CERTIFICATE OF CORRECTION

PATENT NO. : 9,673,081 B2
APPLICATION NO. : 13/874656
DATED : June 6, 2017
INVENTOR(S) : Jebory et al.

It is certified that error appears in the above-identified patent and that said Letters Patent is hereby corrected as shown below:

In the Claims

Column 10, Line 30, "said sidewalk of" should be --said sidewalls of--

Signed and Sealed this
Third Day of April, 2018

Andrei Iancu
*Director of the United States Patent and Trademark Office*